United States Patent
Tseng et al.

(10) Patent No.: US 12,321,607 B2
(45) Date of Patent: Jun. 3, 2025

(54) MEMORY DEVICE AND METHOD FOR OPERATING THE SAME

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Tian-Cih Bo, Zhubei (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 272 days.

(21) Appl. No.: 18/069,255

(22) Filed: Dec. 21, 2022

(65) Prior Publication Data

US 2024/0012567 A1 Jan. 11, 2024

Related U.S. Application Data (60) Provisional application No. 63/359,890, filed on Jul. 11, 2022.

(51) Int. Cl.
*G11C 7/02* (2006.01)
*G06F 3/06* (2006.01)

(52) U.S. Cl.
CPC .......... *G06F 3/0614* (2013.01); *G06F 3/0659* (2013.01); *G06F 3/0673* (2013.01)

(58) Field of Classification Search
CPC ....... G11C 5/063; G11C 7/18; G11C 11/4097; G11C 5/025; G11C 5/04
USPC ..................................................... 365/63, 51
See application file for complete search history.

(56) References Cited

U.S. PATENT DOCUMENTS

| | | | |
|---|---|---|---|
| 10,950,622 B2 * | 3/2021 | Kondo | ............ H10B 43/10 |
| 2007/0047295 A1 * | 3/2007 | Cho | ............ B82Y 10/00 |
| | | | 365/158 |
| 2018/0025783 A1 | 1/2018 | Choi | |
| 2018/0075919 A1 | 3/2018 | Pang | |

OTHER PUBLICATIONS

Seok-Hee Lee: "The Rise of Memory in the Ever-Changing AI Era-From Memory to More-Than-Memory"; 2022 Symposium on VLSI Technology & Circuits Digest of Technical Papers; pp. 272-275.
Kim, et al.: "Analysis of Failure Mechanisms During the Long-Term Retention Operation in 3-D NAND Flash Memories"; IEEE Transactions on Electron Devices, vol. 67, No. 12, Dec. 2020; pp. 5472-5478.

* cited by examiner

*Primary Examiner* — Son T Dinh
(74) *Attorney, Agent, or Firm* — McClure, Qualey & Rodack, LLP (57) ABSTRACT

A memory device is provided. The memory device includes channel layers, word lines, memory layers disposed between the channel layers and the word lines, and memory cells defined at cross-points of the channel layers and the word lines. The memory device is configured for performing a first operation for m times and a second operation for n times, and m is equal to or larger than n. In the first operation, a first electric field is produced in a portion of the memory layers. The word lines are configured for producing a second electric field in the second operation in the portion of the memory layers, and a field direction of the second electric field is different from a field direction of the first electric field.

18 Claims, 7 Drawing Sheets

MEMORY DEVICE AND METHOD FOR OPERATING THE SAME

This application claims the benefit of U.S. provisional application Ser. No. 63/359,890, filed Jul. 11, 2022, the subject matter of which is incorporated herein by reference.

TECHNICAL FIELD

This disclosure relates to a memory device and a method for operating the same.

BACKGROUND

Three-dimensional (3D) vertical memory structures have been developed for purposes of decreasing volume, reducing weight, increasing power density, improving portability, and so on. However, it is founded that lateral charge migration happens in various operations of memory devices because the target memory cell shares its charge trapping layer with adjacent memory cells. As the number of layers in a 3D vertical memory structure increases, lateral charge migration becomes a critical issue for reliability due to scaling-down in the lateral direction. For example, change of threshold voltage induced by lateral charge migration increases with the number of program/erase cycles. Enhancing the reliability through physical separation of a charge trapping layer has been proposed. However, this solution suffers from technical challenge in the manufacturing process.

SUMMARY

This disclosure provides a memory device and a method for operating the same to suppress lateral charge migration, so as to improve the reliability.

A memory device according to the disclosure comprises a plurality of channel layers, a plurality of word lines, a plurality of memory layers disposed between the channel layers and the word lines, and a plurality of memory cells defined at cross-points of the channel layers and the word lines. The memory device is configured for performing a first operation for m times and a second operation for n times, and m is equal to or larger than n. In the first operation, a first electric field is produced in a portion of the memory layers. The word lines are configured for producing a second electric field in the second operation in the portion of the memory layers, and a field direction of the second electric field is different from a field direction of the first electric field.

A method for operating a memory device according to the disclosure comprises performing a first operation for m times and performing a second operation for n times, wherein m is equal to or larger than n. The memory device comprises a plurality of channel layers, a plurality of word lines, a plurality of memory layers disposed between the channel layers and the word lines, and a plurality of memory cells defined at cross-points of the channel layers and the word lines. In the first operation, a first electric field is produced in a portion of the memory layers. In addition, performing the second operation comprises producing a second electric field in the portion of the memory layers using the word lines, wherein a field direction of the second electric field different from a field direction of the first electric field.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. For clarity, the elements may not be drawn to scale. In addition, some elements and/or reference numerals may be omitted from some drawings. It is contemplated that the elements and features of one embodiment can be beneficially incorporated in another embodiment without further recitation.

This disclosure provides a memory device. The memory device comprises a plurality of channel layers, a plurality of word lines, a plurality of memory layers disposed between the channel layers and the word lines, and a plurality of memory cells defined at cross-points of the channel layers and the word lines. The memory device is configured for performing a first operation for m times and a second operation for n times, and m is equal to or larger than n. For example, m is an integer from 1 to 100,000, and n is an integer from 1 to 1,000, but not limited thereto. In the first operation, a first electric field is produced in a portion of the memory layers. The word lines are configured for producing a second electric field in the second operation in the portion of the memory layers, and a field direction of the second electric field is different from a field direction of the first electric field.

The second electric field produced in the second operation is used as a recovery electric field to provide a recovery stress for suppressing charge migration in the lateral direction induced by a stress produced by the first electric field during the first operation. The lateral migrated charges in a continuously-disposed memory layer, particularly in the charge trapping layer thereof, can be recovered and back to their initial positions after applying the recovery stress.

Specifically, in the second operation, the second electric field can be produced by a first voltage applied to one of the word lines that corresponds to the portion of the memory layers and a second voltage applied to another one of the word lines that corresponds the portion. The first voltage can be 1 V to 3 V, and the second voltage can be 7 V to 10 V. In some embodiments, in the first operation, the first electric field is produced by a first voltage applied to a first word line of a pair of word lines and a second voltage applied to a second word line of the pair of word lines, and in the second operation, the second electric field can be produced by the second voltage applied to the first word line and the first voltage applied to the second word line. In some embodiments, in the second operation, the second electric field is produced by a first voltage or first voltages applied to the word lines that are located at one side corresponding to the portion of the memory layers and a second voltage or second voltages applied to the word lines that are located at another side corresponding to the portion. In such embodiments, in the second operation, second electric fields can be produced sequentially through a corresponding memory layer comprising the portion.

Figure 1:
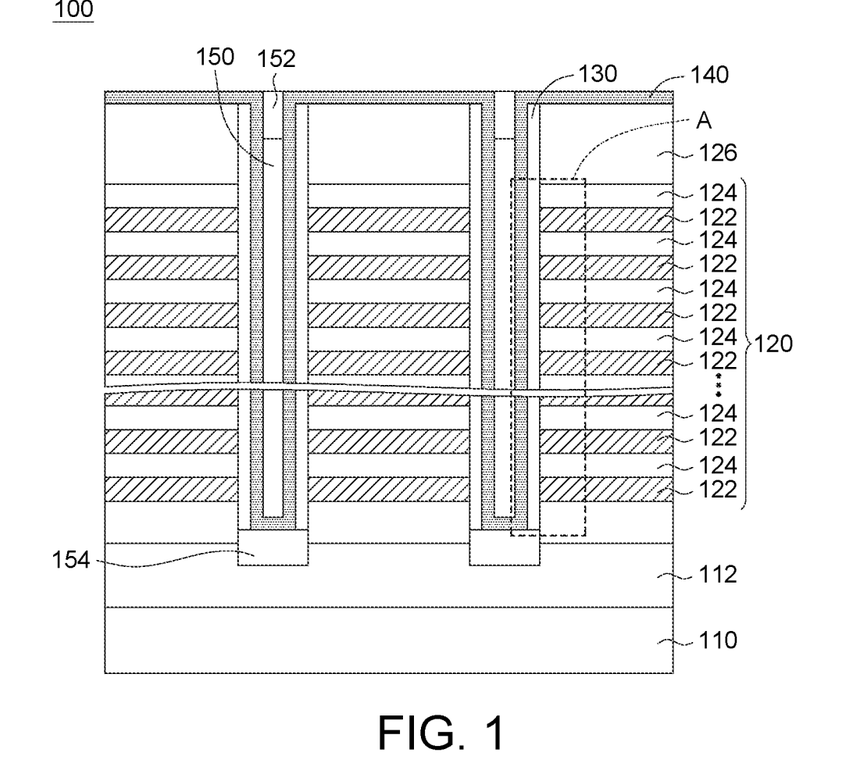
FIG. 1 shows an exemplary implementation of a memory device according to the disclosure.
Figure 3A:
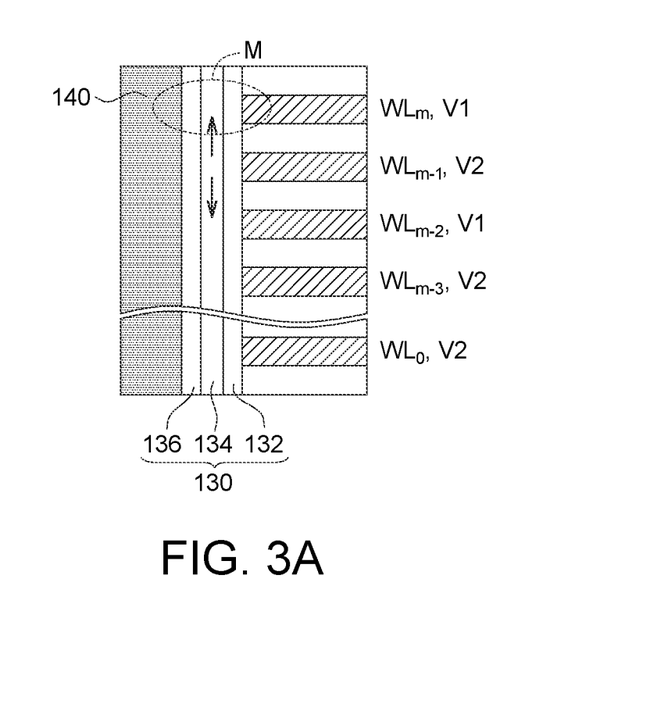
FIGS. 3A-3B show an exemplary implementation of the method according to the disclosure.
Figure 3B:
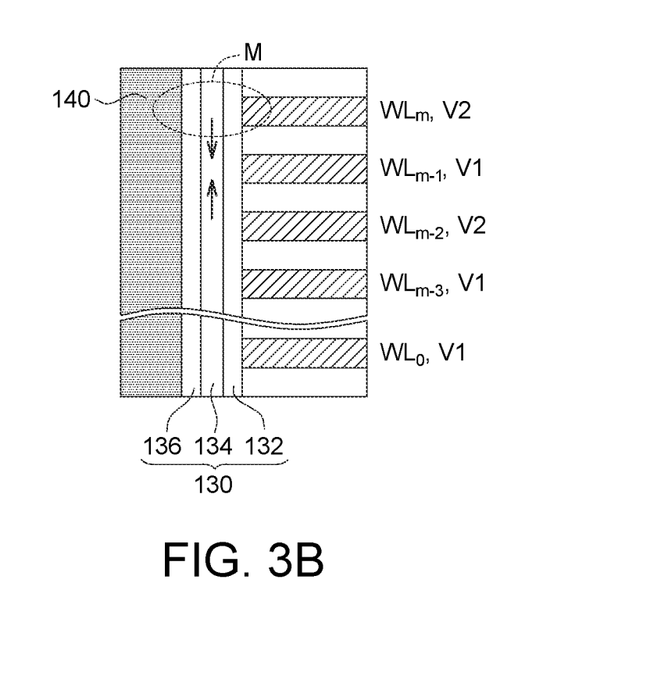

Referring to FIG. 1, an exemplary implementation of the memory device according to the disclosure is shown. The exemplary memory device 100 as shown in FIG. 1 comprises a substrate 110, a plurality of stacks 120, a plurality of memory layers 130, and a plurality of channel layers 140. The stacks 120 are disposed on the substrate 110 and separated from each other by trenches. The stacks 120 comprise conductive strips 122 and dielectric strips 124 disposed alternately, the conductive strips 122 comprise the word lines, such as word lines $WL_0$ to $WL_m$ as indicated in FIGS. 3A-3B to FIGS. showing more details of the portion A in FIG. 1. The memory layers 130 are disposed on sidewalls of the stacks 120. The channel layers 140 are disposed on the memory layers 130.

Specifically, as shown in FIGS. 3A-3B to FIGS. 5A-5C showing more details of the portion A in FIG. 1, the memory layers 130 can comprise blocking layers 132 disposed on the sidewalls of the stacks 120, charge trapping layers 134 disposed on the blocking layers 132, and tunneling layers 136 disposed on the charge trapping layers 134. In such embodiments, the channel layers 140 are disposed on the tunneling layers 136. In addition, the first electric field and the second electric field are produced in the charge trapping layers 134. The blocking layers 132 can be formed of oxide. The charge trapping layers 134 can be formed of nitride. The tunneling layers 136 can be formed of oxide.

The channel layers 140 can be formed of polysilicon. In some embodiments, as shown in FIG. 1, the channel layers 140 can be provided by a polysilicon layer conformally formed on the substrate 110, the stacks 120, and the memory layers 130.

In some embodiments, the memory device 100 further comprises an underlying conductive layer 112 disposed in the substrate 110 and under the stacks 120. In some embodiments, the memory device 100 further comprises a mask layer 126 disposed on the stacks 120. The mask layer 126 can be formed of oxide. In some embodiments, the memory device 100 further comprises a plurality of dielectric columns 150 disposed in remaining spaces of the trenches. In some embodiments, the memory device 100 further comprises a plurality of conductors 152 disposed on the dielectric columns 150. In some embodiments, the memory device 100 further comprises a plurality of plugs 154 disposed under the dielectric columns 150. The plugs 154 can be disposed under the channel layers 140. The plugs 154 can be formed of polysilicon through a selective epitaxial growing process.

While FIG. 1 exemplarily shows an ONO (oxide-nitride-oxide) type memory having a 3D vertical channel structure, it is contemplated that the memory device according to the disclosure is not limited thereto. For example, the memory device according to the disclosure may be a floating gate memory, a SONOS (Si-oxide-nitride-oxide-Si) type memory, a floating dot memory, a FeFET memory, or the like. In addition, the memory device according to the disclosure may have a 2D flash structure, a 3D flash structure, a NOR structure, a NAND structure, or the like.

This disclosure also provides a method for operating a memory device. The memory device comprises a plurality of channel layers, a plurality of word lines, a plurality of memory layers disposed between the channel layers and the word lines, and a plurality of memory cells defined at cross-points of the channel layers and the word lines. Other details are the same as those described above, and will not be repeated herein.

Figure 2:
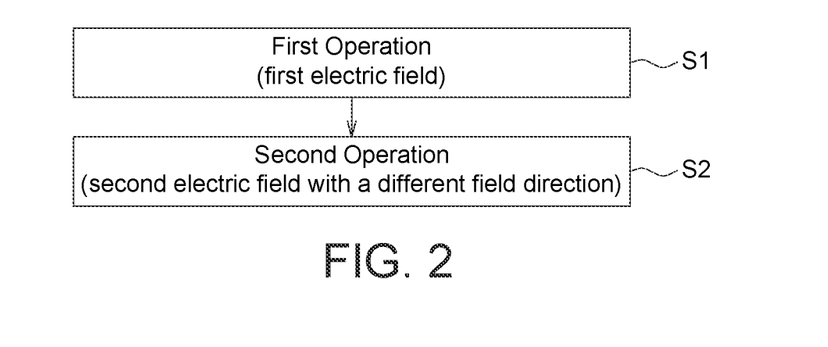
FIG. 2 shows a flow chart of a method for operating a memory device according to the disclosure.

Referring to FIG. 2, a flow chart of the method according to the disclosure is shown. The method according to the disclosure comprises performing a first operation for m times in step S1 and performing a second operation for n times in step S2, wherein m is equal to or larger than n. For example, m is an integer from 1 to 100,000, and n is an integer from 1 to 1,000, but not limited thereto. In some embodiments, m is an integer from 1 to 100,000, and n is 1.

In the first operation, a first electric field is produced in a portion of the memory layers. The first operation can be a read operation, an erase operation, a program operation, or the like.

Performing the second operation comprises producing a second electric field in the portion of the memory layers using the word lines, wherein a field direction of the second electric field different from a field direction of the first electric field. The field direction of the second electric field can be opposite to the field direction of the first electric field. Specifically, in the second operation, the second electric field can be produced by applying a first voltage to one of the word lines that corresponds to the portion of the memory layers and applying a second voltage to another one of the word lines that corresponds the portion. The second voltage can be larger than the first voltage. The first voltage and the second voltage can be determined according to a maximum value and a minimum value of voltages applied in the first operation. For example, the first voltage can be the same as the minimum voltage applied in the first operation, and the second voltage can be the same as the maximum voltage applied in the first operation. In some embodiments, the first voltage can be 1 V to 3 V, and the second voltage can be 7 V to 10 V. In some embodiments, the steps S1 and S2 can be repeated.

Hereinafter, various specific implementations of the method according to the disclosure will be provided with reference to FIGS. 3A-3B to FIG. 6. For ease of understanding, a string of the memory cells M corresponding to the portion A in FIG. 1 is shown in most of these figures for illustration. The conductive strips 122 adjacent to the memory cells M in the string to the string are functioned as the word lines corresponding to the string. A $0^{th}$ word line $WL_0$ to a $m^{th}$ word line $WL_m$ are shown. For example, in conditions that each string comprises 48 memory cells M, m can be 47. Given that the second voltage is larger than the first voltage, an electric field will be produced in the corresponding charge trapping layer 134 with a field direction from a word line applied with the second voltage to a word line applied with the first voltage. Electric fields produced in the operations are indicated by arrows, wherein the field direction is the same as the arrow direction. For clarity of the drawings, some electric fields produced in the operations may be omitted.

FIGS. 3A-3B show an exemplary implementation of the method according to the disclosure. As shown in FIG. 3A, in some operations, the word lines corresponding to a string can be provided as pairs. In such conditions, in the first operation, the first electric field is produced by a first voltage V1 applied to a first word line of a pair of word lines, such as $WL_m$, and a second voltage V2 applied to a second word line of the pair of word lines, such as $WL_{m-1}$. In the second operation, as shown in FIG. 3B, the second electric field can be produced by applying the second voltage V2 to the first word line, i.e., $WL_m$, and applying the first voltage V1 to the second word line, i.e., $WL_{m-1}$. In some embodiments, the first voltage V1 can be 1 V, and the second voltage V2 can be 7 V.

In some embodiments, as shown in FIG. 3A, in the first operation, first voltages V1 and second voltages V2 are applied to all of the word lines $WL_0$ to $WL_m$ corresponding to the string alternately. In such embodiments, in the first operation, first electric fields are produced by first voltages V1 applied to first word lines of pairs of word lines, such as $WL_1, \ldots, WL_{m-2}, WL_m$, and second voltages V2 applied to second word lines of the pairs of word lines, such as $WL_0, \ldots, WL_{m-3}, WL_{m-1}$. In the second operation, second electric fields are produced by applying the second voltages V2 to the first word lines, i.e., $WL_1, \ldots, WL_{m-2}, WL_m$, and applying the first voltages V1 to the second word lines. i.e., $WL_0 \ldots, WL_{m-3}, WL_{m-1}$.

In addition, as shown in FIG. 3A, in the first operation, first electric fields with opposite field directions may be produced. In such embodiments, in the second operation, second electric fields with corresponding opposite field directions, each of which is different from the field direction in the corresponding position during the first operation, are produced to provide recovery stresses. For example, referring also to FIG. 6, after m times of the first operation, in which an electric field with a first field direction (e.g., the downward direction) and an electric field with a second field direction (e.g., the upward direction) are produced, the second operation can be operated with two steps. In the first step, an electric field with a third field direction (e.g., the upward direction) opposite to the first field direction are produced for n times. In the second step, an electric field with a fourth field direction (e.g., the downward direction) opposite to the second field direction are produced for p times. According to some embodiments, m is an integer from 1 to 100,000, n is an integer from 1 to 1,000, and p is an integer from 1 to 1,000. The first operation and the second operation can be repeated.

Figure 4A:
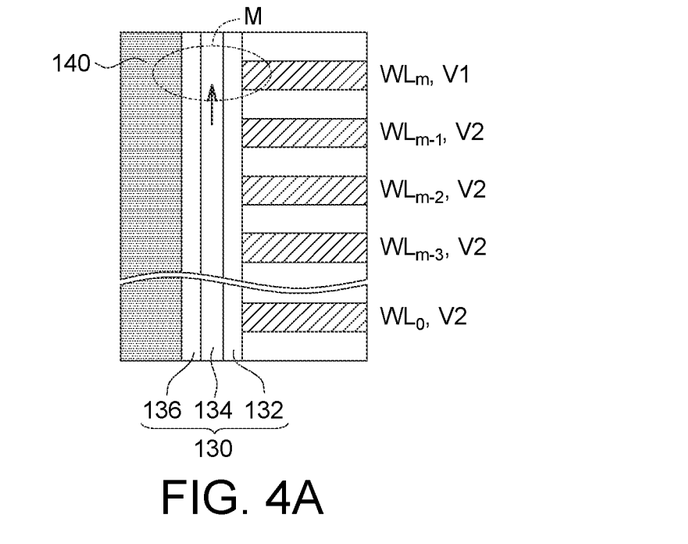
FIGS. 4A-4C show another exemplary implementation of the method according to the disclosure.
Figure 4B:
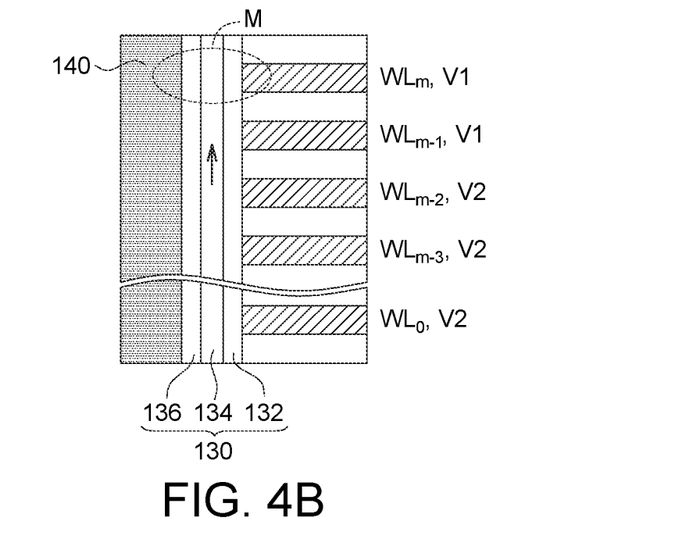
Figure 4C:
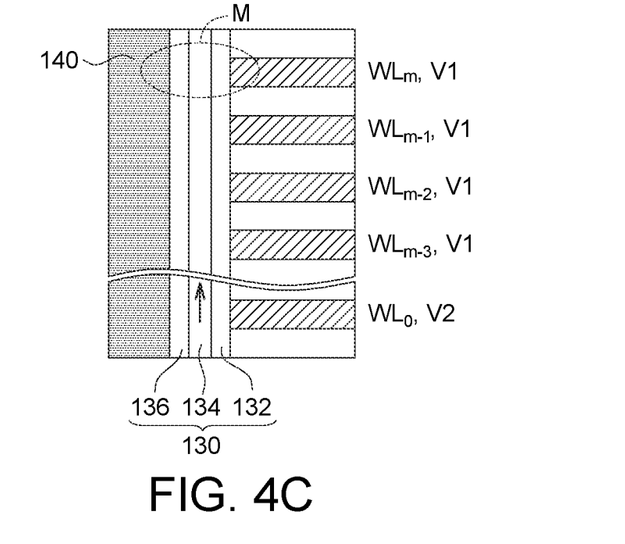

FIGS. 4A-4C show another exemplary implementation of the method according to the disclosure. Various first operations, comprising but not limited to a read operation, an erase operation, a program operation, may lead to lateral charge migration in the memory device. This implementation can be used for suppressing such lateral charge migration without particular limitation. In the second operation, the second electric field is produced by applying a first voltage or first voltages V1 to the word lines that are located at one side corresponding to the portion of the memory layers, in which the first electric field is produced, and applying a second voltage or second voltages V2 to the word lines that are located at another side corresponding to the portion. According to some embodiments, the second voltages V2 can be pass through voltages ($V_{pass}$), which can be 8 V. Correspondingly, the first voltages V1 can be a voltage lower than $V_{pass}$ that can provide an electric field strong enough with $V_{pass}$. For example, the first voltages V1 can be 1 V.

More specifically, a string of the memory cells M corresponding to the portion of the memory layers corresponds to the $0^{th}$ word line $WL_0$ to the $m^{th}$ word line $WL_m$, an $i^{th}$ word line and an $(i+1)^{th}$ word line correspond to the portion of the memory layers, and i is an integer equal to or larger than 0 and smaller than m. In the second operation, the second electric field can be produced by applying first voltages V1 to the $(i+1)^{th}$ word line to the $m^{th}$ word line $WL_m$ and applying second voltages V2 to the $0^{th}$ word line $WL_0$ to the $i^{th}$ word line. For example, if the portion of the memory layers, in which the first electric field is produced, is a portion of the charge trapping layer 134 corresponding to the $(m-1)^{th}$ word line $WL_{m-1}$ and the $m^{th}$ word line $WL_m$, the $i^{th}$ word line is the $(m-1)^{th}$ word line $WL_{m-1}$, and the $(i+1)^{th}$ word line is the $m^{th}$ word line $WL_m$. As shown in FIG. 4A, a first voltage V1 can be applied to the $m^{th}$ word line $WL_m$, and second voltages V2 can be applied to the $0^{th}$ word line $WL_0$ to the $(m-1)^{th}$ word line $WL_{m-1}$, so as to produce the second electric field in the portion.

In some embodiments, as shown in FIGS. 4A-4C, in the second operation, second electric fields can be produced sequentially through a corresponding memory layer comprising the portion. In this manner, the recovery electric field can be swept page by page to fix lateral migrated charges layer by layer. In this implementation, the second electric fields are produced sequentially in a direction from the $m^{th}$ word line $WL_m$ to the $0^{th}$ word line $WL_0$.

Figure 5A:
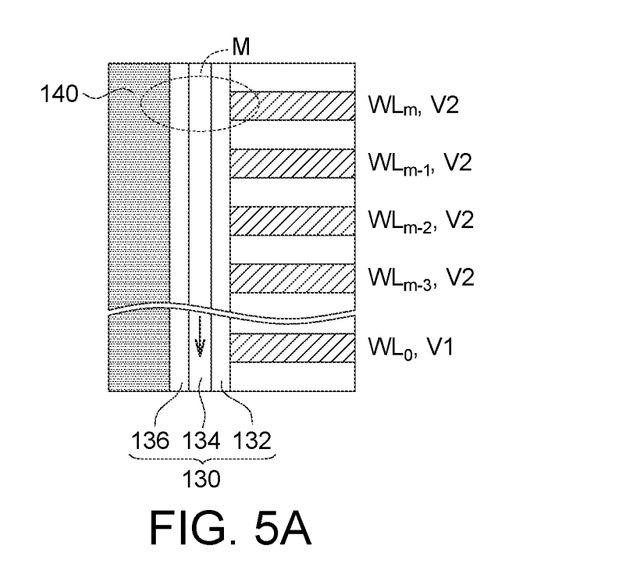
FIGS. 5A-5C show still another exemplary implementation of the method according to the disclosure.
Figure 5B:
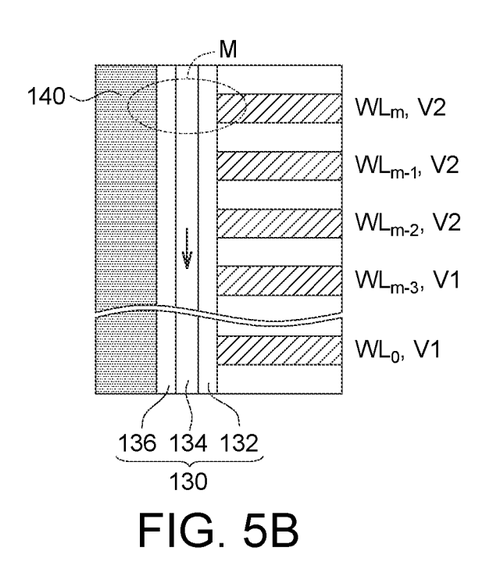
Figure 5C:
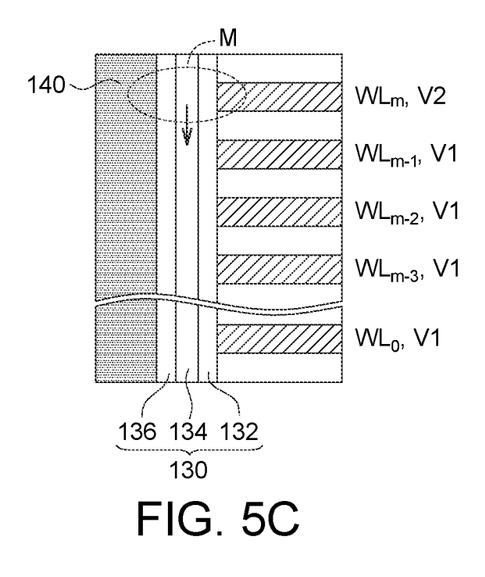
Figure 6:
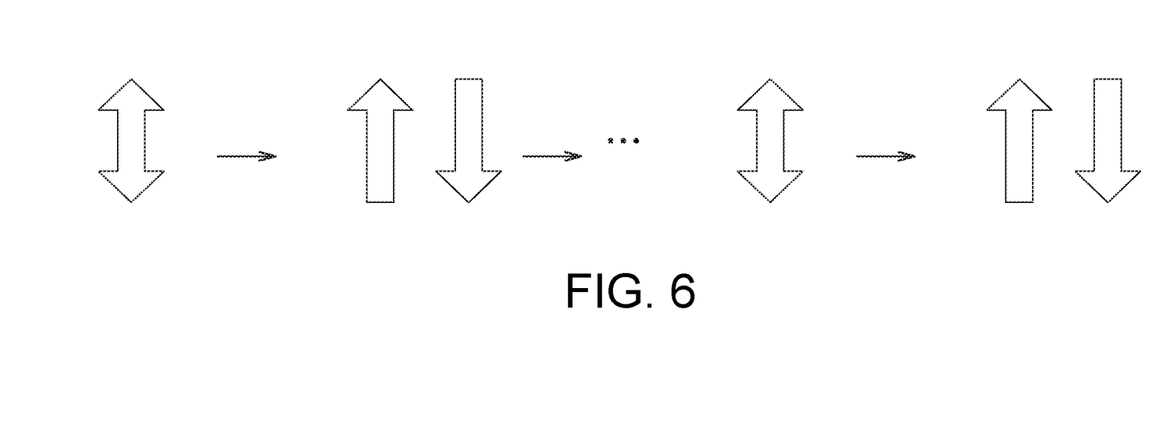
FIG. 6 shows a further exemplary implementation of the method according to the disclosure.

FIGS. 5A-5C show still another exemplary implementation of the method according to the disclosure. This implementation is different from the implementation of FIGS. 4A-4C in that the first voltages V1 and the second voltages V2 are applied to the word lines at different sides of the portion of the memory layers. More specifically, in the second operation, the second electric field is produced by applying first voltages V1 to the $0^{th}$ word line $WL_0$ to the $i^{th}$ word line and applying second voltages V2 to the $(i+1)^{th}$ word line to the $m^{th}$ word line $WL_m$. For example, if the portion of the memory layers, in which the first electric field is produced, is a portion of the charge trapping layer 134 corresponding to the $(m-1)^{th}$ word line $WL_{m-1}$ and the $m^{th}$ word line $WL_m$, the $i^{th}$ word line is the $(m-1)^{th}$ word line $WL_{m-1}$, and the $(i+1)^{th}$ word line is the $m^{th}$ word line $WL_m$. As shown in FIG. 5C, first voltages V1 can be applied to the $0^{th}$ word line $WL_0$ to the $(m-1)^{th}$ word line $WL_{m-1}$, and a second voltage V2 can be applied to the $m^{th}$ word line $WL_m$, so as to produce the second electric field in the portion. In some embodiments, as shown in FIGS. 5A-5C, in the second operation, second electric fields can be produced sequentially through a corresponding memory layer comprising the portion. In this implementation, the second electric fields are produced sequentially in a direction from the $0^{th}$ word line $WL_0$ to the $m^{th}$ word line $WL_m$. Other details similar to the implementation of FIGS. 4A-4C, and will not be repeated herein.

Figure 7:
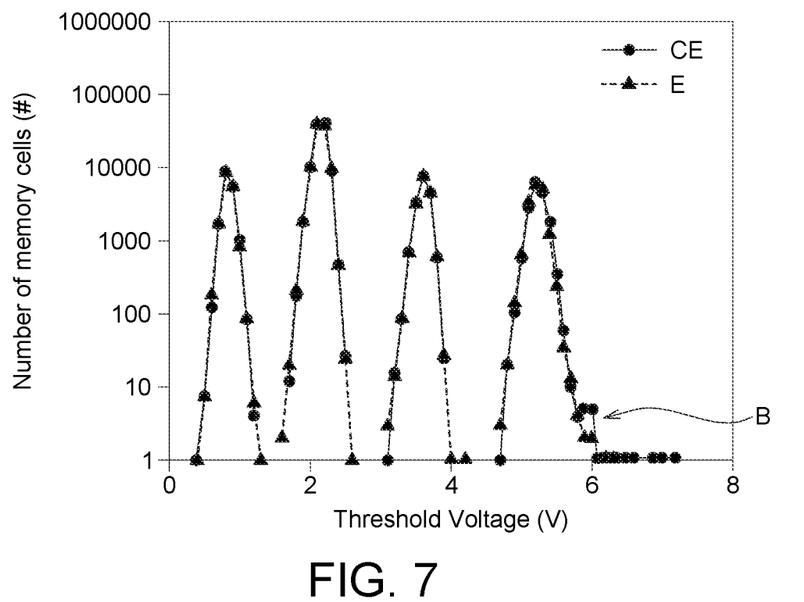
FIG. 7 shows a test result of using the method according to the disclosure.

FIG. 7 shows a test result of using the method according to the disclosure. The example E uses the implementation of FIGS. 3A-3B, wherein the first operation is a read operation, one time of the second operation is performed per 1,000 times of the first operation, the first voltage is 1 V, and the second voltage is 7 V. In contrast, in the comparative example CE, only the first operation is performed. As shown in FIG. 7, a high threshold voltage tail induced by lateral charge migration, as indicated by an arrow B, can be suppressed by the method according to the disclosure. In addition, with the method according to the disclosure, read operation can be performed for up to 1 million times without degradation.

In summary, a memory device and a method for operating the same to suppress lateral charge migration are provided in the disclosure. As such, the reliability issue can be addressed without a technical challenge in the manufacturing process.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
   a plurality of channel layers;
   a plurality of word lines;
   a plurality of memory layers disposed between the channel layers and the word lines; and
   a plurality of memory cells defined at cross-points of the channel layers and the word lines;
   wherein the memory device is configured for performing a first operation for m times and a second operation for n times, and m is equal to or larger than n, wherein in the first operation, a first electric field is produced in a portion of the memory layers, and wherein the word lines are configured for producing a second electric field in the second operation in the portion of the memory layers, and a field direction of the second electric field is different from a field direction of the first electric field,
   wherein in the second operation, the second electric field is produced by a first voltage applied to one of the word lines that corresponds to the portion of the memory layers and a second voltage applied to another one of the word lines that corresponds the portion.

2. The memory device according to claim 1, comprising:
   a substrate;
   a plurality of stacks disposed on the substrate and separated from each other by trenches, the stacks comprising conductive strips and dielectric strips disposed alternately, the conductive strips comprising the word lines;
   the memory layers disposed on sidewalls of the stacks; and
   the channel layers disposed on the memory layers.

3. The memory device according to claim 2, further comprising:
   an underlying conductive layer disposed in the substrate and under the stacks;
   a mask layer disposed on the stacks;
   a plurality of dielectric columns disposed in remaining spaces of the trenches;
   a plurality of conductors disposed on the dielectric columns; and
   a plurality of plugs disposed under the dielectric columns.

4. The memory device according to claim 2, wherein the memory layers comprises:
   blocking layers disposed on the sidewalls of the stacks;
   charge trapping layers disposed on the blocking layers; and
   tunneling layers disposed on the charge trapping layers;
   wherein the channel layers are disposed on the tunneling layers; and
   wherein the first electric field and the second electric field are produced in the charge trapping layers.

5. The memory device according to claim 1, wherein the first voltage is 1 V to 3 V, and the second voltage is 7 V to 10 V.

6. The memory device according to claim 1, wherein in the first operation, the first electric field is produced by the first voltage applied to a first word line of a pair of word lines and the second voltage applied to a second word line of the pair of word lines, and wherein in the second operation, the second electric field is produced by the second voltage applied to the first word line and the first voltage applied to the second word line.

7. The memory device according to claim 1, wherein in the second operation, the second electric field is produced by the first voltage or first voltages applied to the word lines that are located at one side corresponding to the portion of the memory layers and the second voltage or second voltages applied to the word lines that are located at another side corresponding to the portion.

8. The memory device according to claim 7, wherein in the second operation, second electric fields are produced sequentially through a corresponding memory layer comprising the portion.

9. A method for operating a memory device, wherein the memory device comprises a plurality of channel layers, a plurality of word lines, a plurality of memory layers disposed between the channel layers and the word lines, and a plurality of memory cells defined at cross-points of the channel layers and the word lines, and wherein the method comprises:
   performing a first operation for m times, wherein in the first operation, a first electric field is produced in a portion of the memory layers; and
   performing a second operation for n times, comprising:
   producing a second electric field in the portion of the memory layers using the word lines, wherein a field direction of the second electric field different from a field direction of the first electric field;
   wherein m is equal to or larger than n,
   wherein in the second operation, the second electric field is produced by applying a first voltage to one of the word lines that corresponds to the portion of the memory layers and applying a second voltage to another one of the word lines that corresponds the portion.

10. The method according to claim 9, wherein the field direction of the second electric field is opposite to the field direction of the first electric field.

11. The method according to claim 9, wherein the first voltage is 1 V to 3 V, and the second voltage is 7 V to 10 V.

12. The method according to claim 9, wherein in the first operation, the first electric field is produced by the first voltage applied to a first word line of a pair of word lines and the second voltage applied to a second word line of the pair of word lines, and wherein in the second operation, the second electric field is produced by applying the second voltage to the first word line and applying the first voltage to the second word line.

13. The method according to claim 9, wherein in the first operation, first electric fields are produced by first voltages applied to first word lines of pairs of word lines and second voltages applied to second word lines of the pairs of word lines, and wherein in the second operation, second electric fields are produced by applying the second voltages to the first word lines and applying the first voltages to the second word lines.

14. The method according to claim 9, wherein in the second operation, the second electric field is produced by applying the first voltage or first voltages to the word lines that are located at one side corresponding to the portion of the memory layers and applying the second voltage or second voltages to the word lines that are located at another side corresponding to the portion.

15. The method according to claim 14, wherein in the second operation, second electric fields are produced sequentially through a corresponding memory layer comprising the portion.

16. The method according to claim 14, wherein the second voltages are pass through voltages.

17. The method according to claim 9, wherein a string of the memory cells corresponding to the portion of the memory layers corresponds to a $0^{th}$ word line to a $m^{th}$ word line, an $i^{th}$ word line and an $(i+1)^{th}$ word line correspond to the portion of the memory layers, and i is an integer equal to or larger than 0 and smaller than m, and wherein in the second operation, the second electric field is produced by applying first voltages to the $(i+1)^{th}$ word line to the $m^{th}$ word line and applying second voltages to the $0^{th}$ word line to the $i^{th}$ word line.

18. The method according to claim 9, wherein a string of the memory cells corresponding to the portion of the memory layers corresponds to a $0^{th}$ word line to a $m^{th}$ word line, an $i^{th}$ word line and an $(i+1)^{th}$ word line correspond to the portion of the memory layers, and i is an integer equal to or larger than 0 and smaller than m, and wherein in the second operation, the second electric field is produced by applying first voltages to the $0^{th}$ word line to the $i^{th}$ word line and applying second voltages to the $(i+1)^{th}$ word line to the $m^{th}$ word line.

* * * * *